United States Patent
Connolly et al.

(10) Patent No.: US 9,360,812 B2
(45) Date of Patent: Jun. 7, 2016

(54) METHOD AND SYSTEM FOR DOUBLE-SIDED PRINTING OF A SERIES OF SHEETS

(75) Inventors: David P. Connolly, Mt. Pearl (CA); Blair M. Connolly, Paradise (CA)

(73) Assignee: BRITISH BAZAAR COMPANY LIMITED, St. John's, Newfoundland (CA)

( * ) Notice: Subject to any disclaimer, the term of this patent is extended or adjusted under 35 U.S.C. 154(b) by 0 days.

(21) Appl. No.: 13/100,831

(22) Filed: May 4, 2011

(65) Prior Publication Data
US 2012/0229858 A1 Sep. 13, 2012

(30) Foreign Application Priority Data
Mar. 10, 2011 (CA) ..................................... 2733746

(51) Int. Cl.
*G03G 15/23* (2006.01)
*G06F 3/12* (2006.01)
*G06F 17/50* (2006.01)

(52) U.S. Cl.
CPC ............ *G03G 15/231* (2013.01); *G06F 3/1251* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 4,414,579 A * | 11/1983 | Dattilo | ............ | G03B 15/221 355/24 |
| 5,644,494 A * | 7/1997 | Richardson | .......... | B41J 13/0027 700/112 |
| 6,347,794 B2 * | 2/2002 | Scrymgeour | ............ | 273/138.1 |
| 6,916,132 B2 * | 7/2005 | Otsuka | ........................ | B41J 3/60 400/188 |
| 7,209,260 B1 * | 4/2007 | Tanaka | ...................... | G06T 1/60 358/1.16 |
| 2006/0026455 A1 * | 2/2006 | Hwang | ............ | G11B 7/00458 714/5.1 |
| 2008/0024817 A1 * | 1/2008 | Lee | ............................. | 358/1.15 |
| 2008/0074707 A1 * | 3/2008 | Cranitch | ............ | H04N 1/00209 358/403 |
| 2008/0239331 A1 * | 10/2008 | Runbeck | ................. | G07C 13/00 358/1.1 |
| 2009/0098922 A1 * | 4/2009 | Cummings et al. | ............ | 463/17 |
| 2010/0033750 A1 * | 2/2010 | Tischler | ................. | G06K 15/02 358/1.14 |

* cited by examiner

*Primary Examiner* — Tammy Pham
*Assistant Examiner* — Keara Harris
(74) *Attorney, Agent, or Firm* — Thompson Hine LLP (57) ABSTRACT

A method and a system for double-sided printing of a series of sheets is provided. First printing data for being printed onto a first surface of the series of sheets are provided. The first printing data comprise a plurality of first subsets, each first subset for being printed onto one sheet. Second printing data for being printed onto a second surface of the series of sheets are provided. The second printing data comprise a plurality of second subsets. Each second subset is associated with a respective first subset. A first print is printed in dependence upon the first printing data onto the first surface of the series of sheets. A second print is printed in dependence upon the second printing data onto the second surface of the series of sheets. The first print is scanned and first print data in dependence thereupon are provided. The second print is scanned and second print data in dependence thereupon are provided. For each sheet the first print data and the second print data are processed to determine if the second print data are associated with the respective first print data and data indicative thereof are stored in a database.

3 Claims, 15 Drawing Sheets

| | |
|---|---|
| printing a second print in dependence upon the second printing data onto the second surface of the series of sheets | 22 |
| scanning the second print and providing second print data in dependence thereupon | 24 |
| processing for each sheet the first print data and the second print data to determine if the second print data are associated with the respective first print data and storing data indicative thereof | 26 |
| determining rejection data indicative of a rejected sheet if the second print data are other than associated with the respective first print data | 28 |
| comparing the first and the second print data with the respective first and second printing data to determine a first and a second comparison result, respectively, and determining the rejection data if one of the first and the second comparison result is other than indicative of a match within a predetermined threshold | 30 |
| determining location data in dependence upon a location of the rejected sheet within the series | 32 |

METHOD AND SYSTEM FOR DOUBLE-SIDED PRINTING OF A SERIES OF SHEETS

FIELD

The present invention relates to printing processes, and more particularly to a method and system for double-sided printing of a series of sheets.

This application claims priority to Canadian Patent Application No. 2,733,746, entitled METHOD AND SYSTEM FOR DOUBLE-SIDED PRINTING OF A SERIES OF SHEETS and filed on Mar. 10, 2011, the entire contents of which are hereby incorporated by reference herein.

BACKGROUND

Instant lottery games have become an important source of income to governments and numerous non-for-profit organizations. Typically, a set of instant lottery tickets is imaged with play and prize value indicia under a scratch-off coating or break-open tabs according to a predetermined prize structure. The prize structure comprises a small number of large value prize tickets, a number of lesser value prize tickets, and a large number of void tickets. The prizes are distributed randomly to the tickets such that each player has an equal chance to win one of the prizes.

The tickets are then distributed to ticket retailers—such as, for example, convenience stores, supermarkets, gas stations, gift shops, etc.—for dispensing the tickets to consumers and for validating the tickets when they are presented for redemption.

With numerous instant lottery games on the market it has become a challenge to sustain public interest. In response, variable larger valued prizes such as, for example, additional prizes and jackpots are offered in various instant lottery games. In order to enable instant lottery games having variable prizes, the instant lottery tickets are provided with interconnected data printed—typically in the form of a barcode—in a secure area, which is hidden prior to the purchase of the ticket, and on an outside surface of the ticket.

Instant lottery tickets are typically made of a sheet material such as, for example, thin cardboard or boxboard, and are printed in a double-sided fashion. Unfortunately, state of the art printing processes are not capable of printing both sides of the tickets in a single pass through the printing equipment making double sided printing of interconnected data a difficult and labor intensive process. Furthermore, state of the art printing processes do not provide a verification process to ensure that the interconnected data have been correctly applied to each ticket.

It is desirable to provide a method and system for double-sided printing of a series of sheets in a single pass.

It is also desirable to provide a method and system for double-sided printing of a series of sheets that ensures that interconnected data have been correctly applied to each sheet.

It is also desirable to provide a method and system for double-sided printing of a series of sheets that ensures that the series of sheets is printed in a predetermined order.

SUMMARY

Accordingly, one object of the present invention is to provide a method and system for double-sided printing of a series of sheets in a single pass.

Another object of the present invention is to provide a method and system for double-sided printing of a series of sheets that ensures that interconnected data have been correctly applied to each sheet.

Another object of the present invention is to provide a method and system for double-sided printing of a series of sheets that ensures that the series of sheets is printed in a predetermined order.

According to one aspect of the present invention, there is provided a method for double-sided printing of a series of sheets. First printing data for being printed onto a first surface of the series of sheets are provided. The first printing data comprise a plurality of first subsets, each first subset for being printed onto one sheet. Second printing data for being printed onto a second surface of the series of sheets are provided. The second printing data comprise a plurality of second subsets. Each second subset is associated with a respective first subset. A first print is printed in dependence upon the first printing data onto the first surface of the series of sheets. A second print is printed in dependence upon the second printing data onto the second surface of the series of sheets. The first print is scanned and first print data in dependence thereupon are provided. The second print is scanned and second print data in dependence thereupon are provided. For each sheet the first print data and the second print data are processed to determine if the second print data are associated with the respective first print data and data indicative thereof are stored in a database.

According to one aspect of the present invention, there is provided a system for double-sided printing of a series of sheets. The system comprises a first printing mechanism for printing a first print in dependence upon first printing data onto a first surface of a series of sheets. The first printing data comprise a plurality of first subsets, each first subset for being printed onto one sheet. The system further comprises a second printing mechanism for printing a second print in dependence upon second printing data onto a second surface of the series of sheets. The second printing data comprise a plurality of second subsets. Each second subset is associated with a respective first subset. The system further comprises at least a scanning mechanism for: scanning the first print and providing first print data in dependence thereupon; and, scanning the second print and providing second print data in dependence thereupon. A conveying mechanism is connected to the first printing mechanism, the second printing mechanism, and the at least a scanning mechanism. The conveying mechanism receives the series of sheets and conveys the same. A database is provided for storing the first and second print data therein. A processor is connected to the first printing mechanism, the second printing mechanism, the at least a scanning mechanism, and the database. The processor provides the first printing data and the second printing data; receives the first print data and the second print data; and, processes for each sheet the first print data and the second print data to determine if the second print data are associated with the respective first print data.

According to one aspect of the present invention, there is provided a storage medium having stored therein executable commands for execution on a processor of a control computer. The processor when executing the commands controls double-sided printing of a series of sheets. The processor provides first printing data for being printed onto a first surface of the series of sheets to produce a first print. The first printing data comprise a plurality of first subsets, each first subset for being printed onto one sheet. The processor further provides second printing data for being printed onto a second surface of the series of sheets to produce a second print. The second printing data comprise a plurality of second subsets.

Each second subset is associated with a respective first subset. The processor receives first print data indicative of the first print and second print data indicative of the second print. The processor processes for each sheet the first print data and the second print data to determine if the second print data are associated with the respective first print data and provides data indicative thereof.

An advantage of the present invention is that it provides a method and system for double-sided printing of a series of sheets in a single pass.

A further advantage of the present invention is that it provides a method and system for double-sided printing of a series of sheets that ensures that interconnected data have been correctly applied to each sheet.

A further advantage of the present invention is that it provides a method and system for double-sided printing of a series of sheets that ensures that the series of sheets is printed in a predetermined order.

BRIEF DESCRIPTION OF THE DRAWINGS

One embodiment of the present invention is described below with reference to the accompanying drawings, in which.

DETAILED DESCRIPTION

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, certain methods and materials are now described.

Figure 1A:
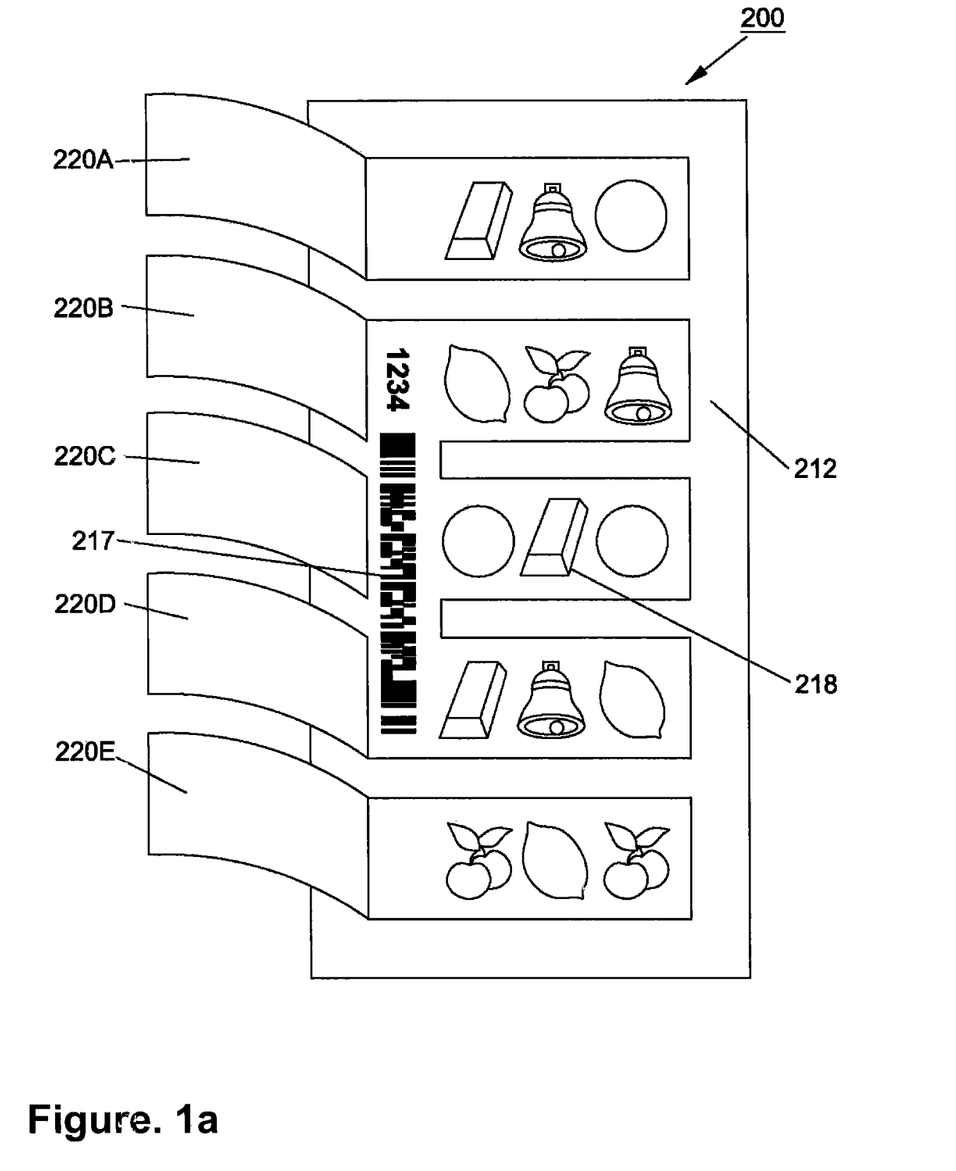
FIGS. 1a to 1c are simplified block diagrams illustrating an instant lottery ticket having interconnected data printed thereon.
Figure 1B:
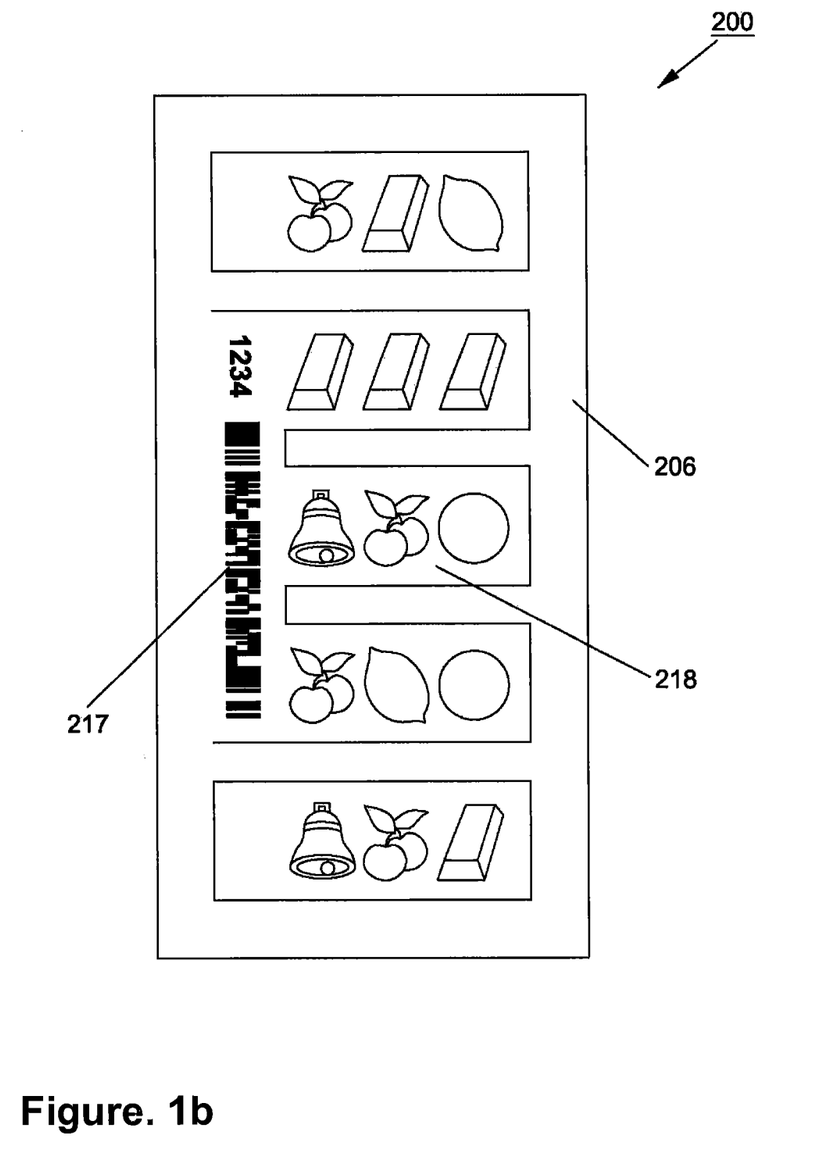
Figure 1C:
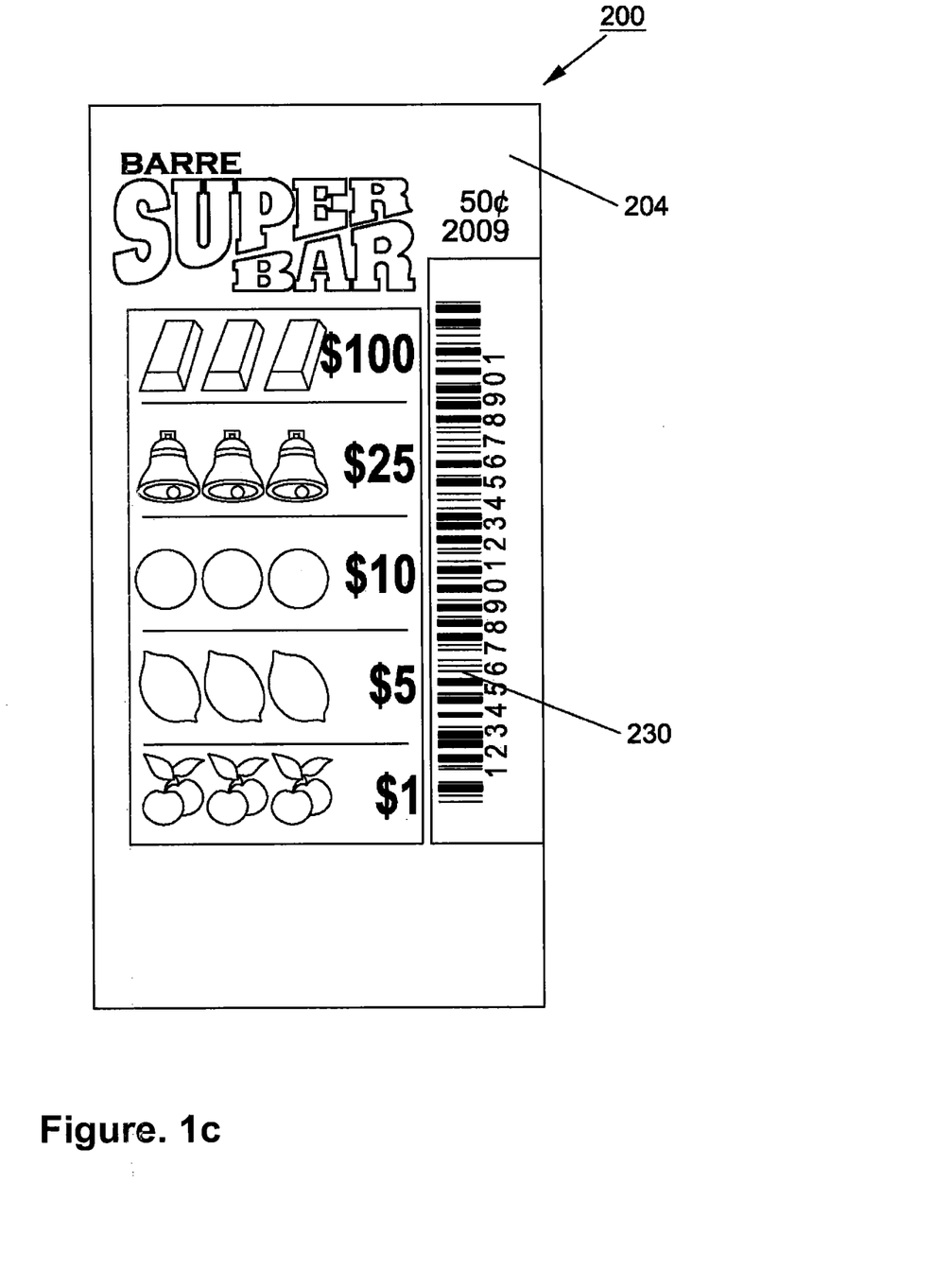

FIGS. 1a to 1c illustrate an instant lottery ticket 200 having interconnected data printed thereon. The instant lottery ticket 200 comprises a top layer 218 and a bottom layer 212. The bottom layer 212 is partially adhered to the top layer 218 at predetermined areas using, for example, an adhesive suitable for use with the material of the top layer 218 and the bottom layer 212. The top layer 218 and the bottom layer 212 are typically made of a semi-rigid sheet of paper, cardboard, or boxboard. Tabs 220A to 220E are disposed in the bottom layer 212 such that a portion is severable from the bottom layer 212 for revealing a predetermined portion of the lower surface of the top sheet 218 comprising a game area and an identifier 217. The identifier is printed on the lower surface 206 of the top layer 218 in the form of a barcode such as, for example, a linear barcode, or a matrix barcode and is indicative of the ticket being a winning ticket with an associated prize or a losing ticket. The top surface 204 of the top layer 218 has printed thereon information about the game and a second identifier 230 in the form of a barcode such as, for example, a linear barcode, or a matrix barcode. A retailer "activates" the lottery ticket by reading the second identifier 230 and provides it to a central data processing unit prior sale of the lottery ticket Linking a portion of the data of the second identifier 230 to a portion of the data of the first identifier 217 enables the lottery organization to provide instant lottery games with varying prizes for winning tickets.

Referring to FIGS. 2a to 2m and FIG. 3, a system 100 and a method for double-sided printing of a series of sheets according to an embodiment of the invention is provided. The system 100 can be employed for double-sided printing of a series of sheets—known in the industry as "forms"—for manufacturing instant lottery tickets as illustrated in FIGS. 1a to 1c. The system 100 comprises feeders 108A to 108C for feeding a series of pre-printed sheets in a predetermined order onto conveyor 102, which have been printed in a first stage of the manufacturing process prior provision to the system 100 for printing of the interconnected data thereon.

Figure 1D:
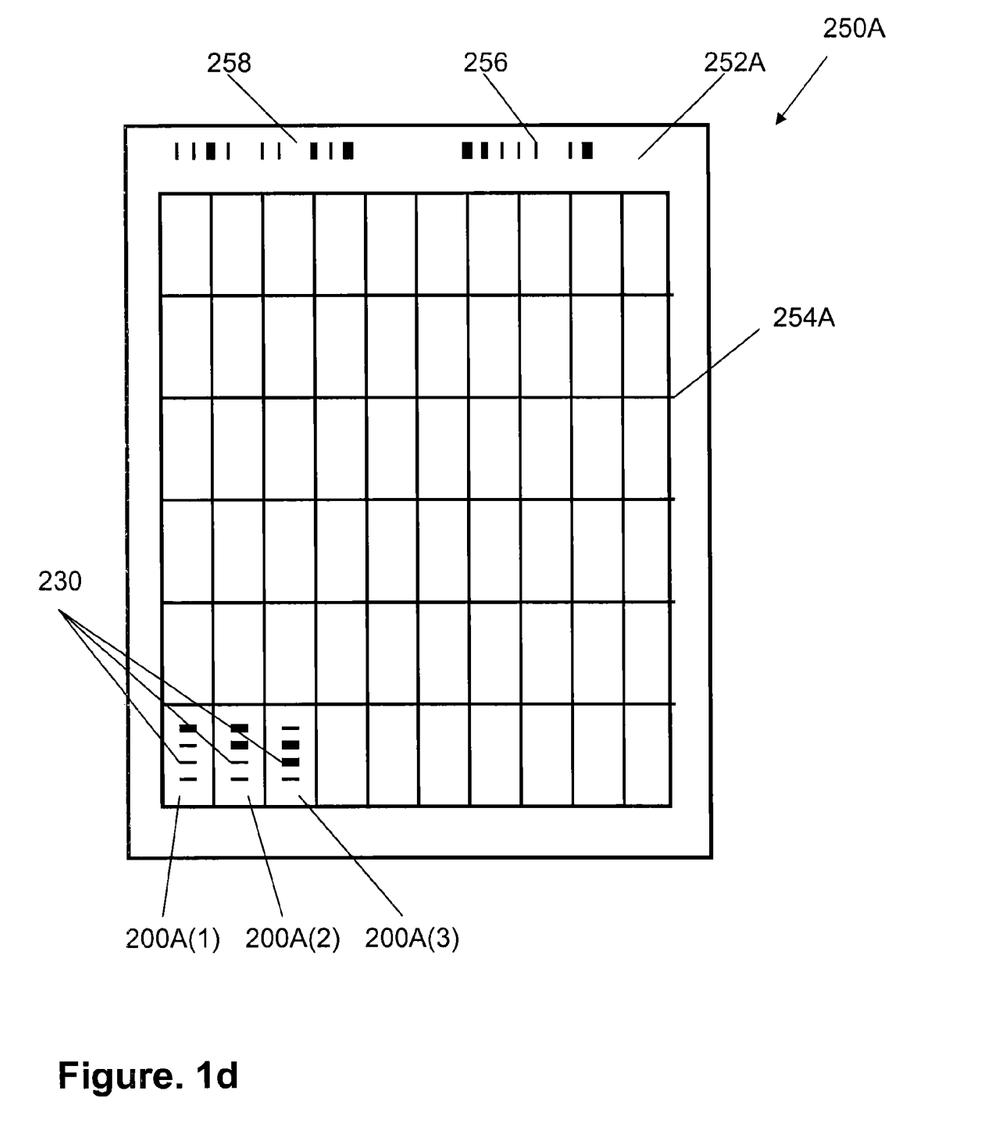
FIGS. 1d and 1e are simplified block diagrams illustrating a form for printing a plurality of instant lottery tickets having interconnected data printed thereon.
Figure 1E:
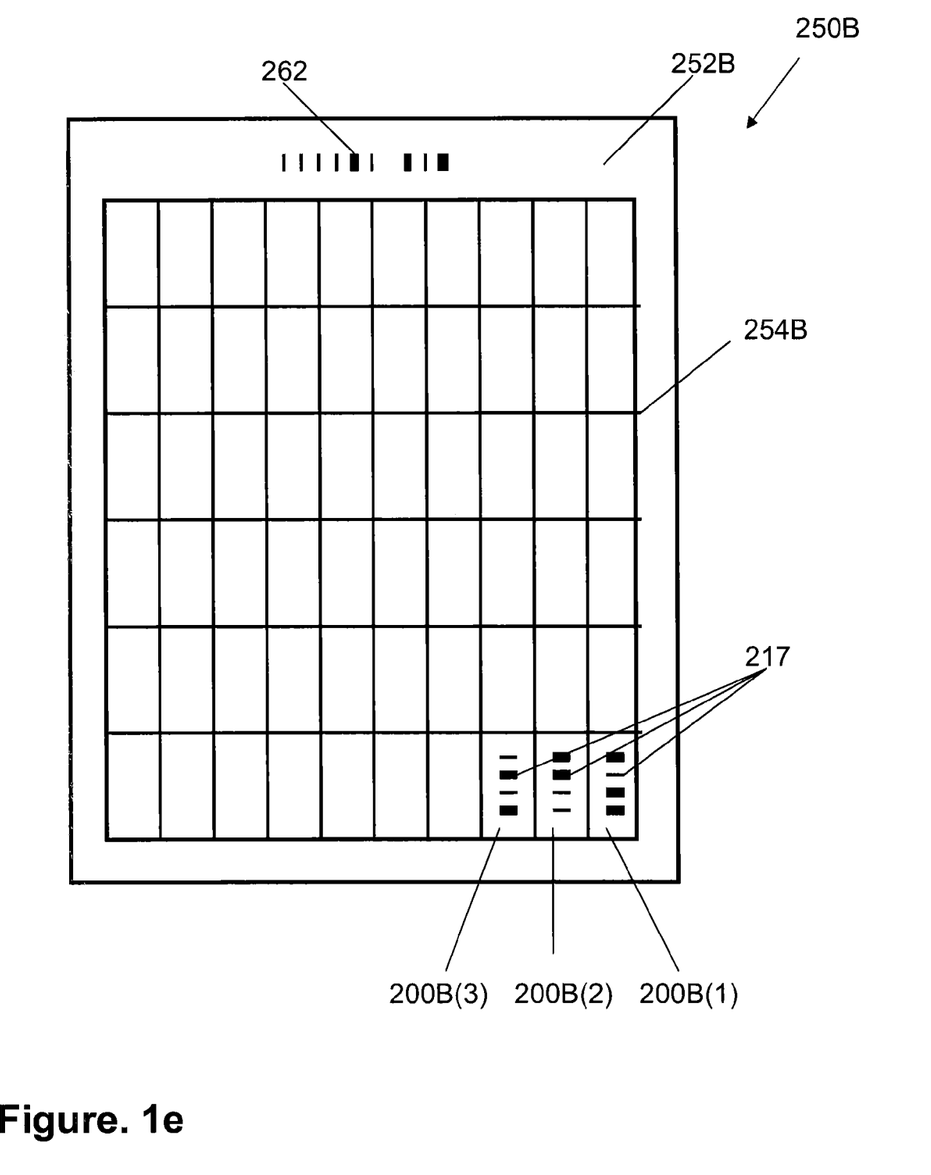

In the first stage of the instant ticket manufacturing process games are laid out for printing using standard software such as, for example, CorelDraw® or Adobe Acrobat. A plurality of tickets is placed onto a single form for printing, as illustrated in FIGS. 1d and 1e. Depending on the game, different types of forms are provided such as, for example: forms having winning tickets printed thereon; forms having losing tickets printed thereon; and, forms having winning and losing tickets printed thereon. Each type of form is printed in a quantity sufficient for the designed game plus, in one case, some overrun of approximately 10%. An array 254A and 254B of tickets 200A(1), 200A(2), etc. and 200B(1), 200B(2), etc. can be printed on the top surface 250A and the bottom surface 250B of each form, respectively. Furthermore, the top surface 250A has a form identifier 256 such as, for example, a linear barcode or a matrix barcode printed in edge portion 252A. The form identifier may be unique for each form for quality and manufacturing control purposes and indicative of the type of form.

Using the system 100, interconnected first 217 and second 230 identifiers are printed for each ticket on both sides 250A and 250B of each form. The interconnected first 217 and second 230 identifiers may be unique for each ticket. Further, a first print identifier 258 and a second print identifier 262, for example, a linear barcode or a matrix barcode unique for each print, can be printed in the edge portions 252A and 252B, respectively.

Figure 3:
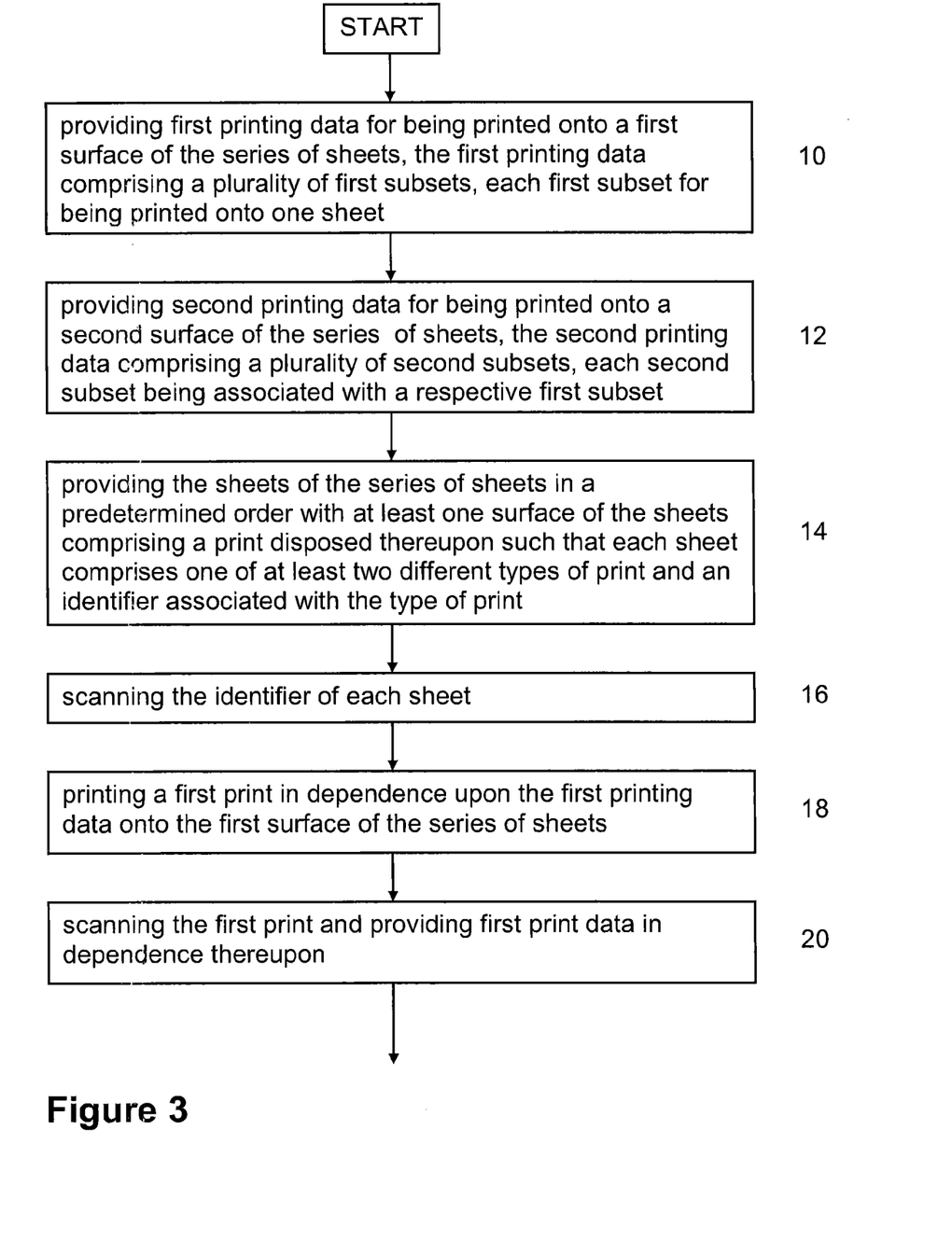

Prior to the printing, printing process data are generated—steps 10 and 12 in FIG. 3—using, for example, computer 140 and stored in database 152 connected to the computer 140, for example, via a computer network 150 such as a Local Area Network (LAN) or the Internet. The data can be indicative of the order the forms—winning, losing and mixed tickets—will be fed onto the conveyor 102 to ensure that a batch of tickets obtained after printing and cutting of the forms is substantially randomized, thus obviating manually shuffling of the tickets after the cutting. Furthermore, first printing data for being printed onto the first surface of each form of the series of forms and second printing data for being printed onto the second surface of each form of the series of forms are generated and stored in the database 152. The printing data are, for example, in the form of barcodes, symbols, alphanumeric codes or a combination thereof. The printing data are indicative of, for example, winning/losing ticket for prize verification, codes for use by players in "second chance" or "auxiliary" contests, and information to activate tickets in computerized verification systems. Data indicative of the first print identifier 258 and the second print identifier 262 can be generated and stored in the database 152 for identifying the first and the second print on each form. The data are generated, for example, using standard software programs such as, for example, Microsoft Excel, stored in memory 144 and executed on processor 142 of the computer 140 through user interaction via keyboard 148 and display 146.

The printing process data are loaded into control computer 130 connected to the database 152, for example, via the computer network 150. The control computer can be connected to the various components of the printing system 100—as indicated by the dashed lines in FIG. 2*a*—for control and verification purposes. The control computer 130 performs the printing control and verification process, for example, by executing executable commands using processor 132 with the executable commands being stored in a storage medium such as memory 134.

Pallets of pre-printed forms are loaded into the computer controlled feeders 108A to 108C such that a predetermined type of form is provided to each feeder—step 14 in FIG. 3. The feeders 108A to 108C can be standard type sheet material feeders used in the printing industry. Of course, various numbers of feeders are employable, for example, depending on the number of different types of forms. As the conveyor 102 moves—as indicated by the block arrows in FIG. 2*a*—the control computer 130 instructs the feeders 108A to 108C to discharge forms 250 into a predetermined lug space on the conveyor 102 in the predetermined order producing a predetermined series of forms, as illustrated in FIGS. 2*b* and 2*c*.

After being fed onto the conveyor 102 each form 250 passes barcode scanner 110 for reading the form identifier 256—step 16 in FIG. 3. The barcode scanner 110 can be a standard barcode scanner placed above the conveyor 102 at a location suitable for reading the identifier 256, as illustrated in FIG. 2*d*. Optionally the barcode scanner 110 is adjustable mounted to a rail crossing the conveyor 102 to enable adjustment in case the identifier 256 is placed at a different location on the form 250. The barcode scan data are provided to the control computer 130 for comparison with the printing process data indicative of the order of the forms 250. If the comparison is indicative of other than a match, the system is, in one case, automatically stopped and the operators alerted to manually insert the correct form. Optionally, the barcode scanner 110 is also used to check for empty lug spaces and double forms.

Figure 2A:
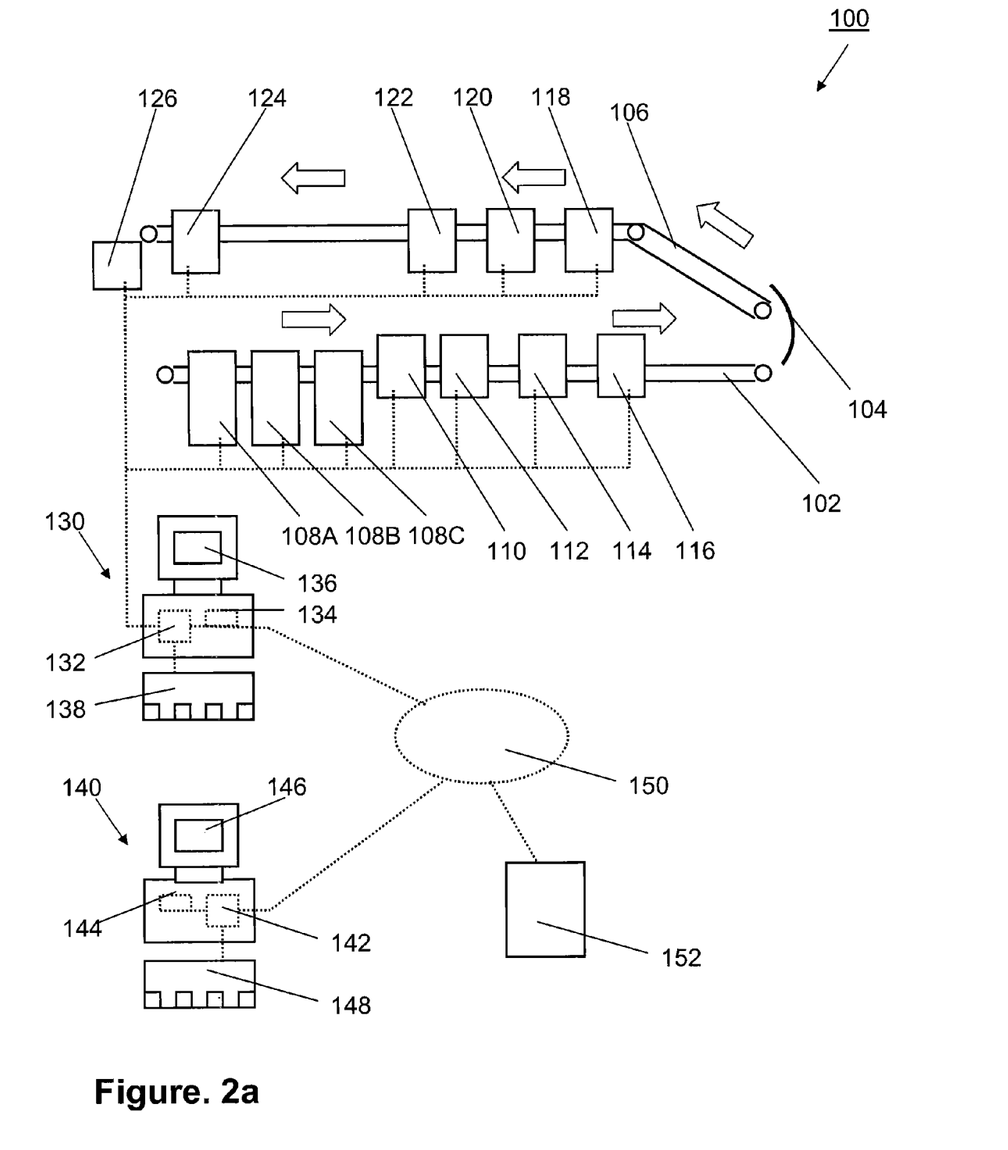
FIGS. 2a to 2m are simplified block diagrams illustrating a system for double-sided printing of a series of sheets according to one embodiment of the invention; and, FIG. 3 is a simplified flow diagram illustrating a method for double-sided printing of a series of sheets according to an embodiment of the invention.
Figure 2B:
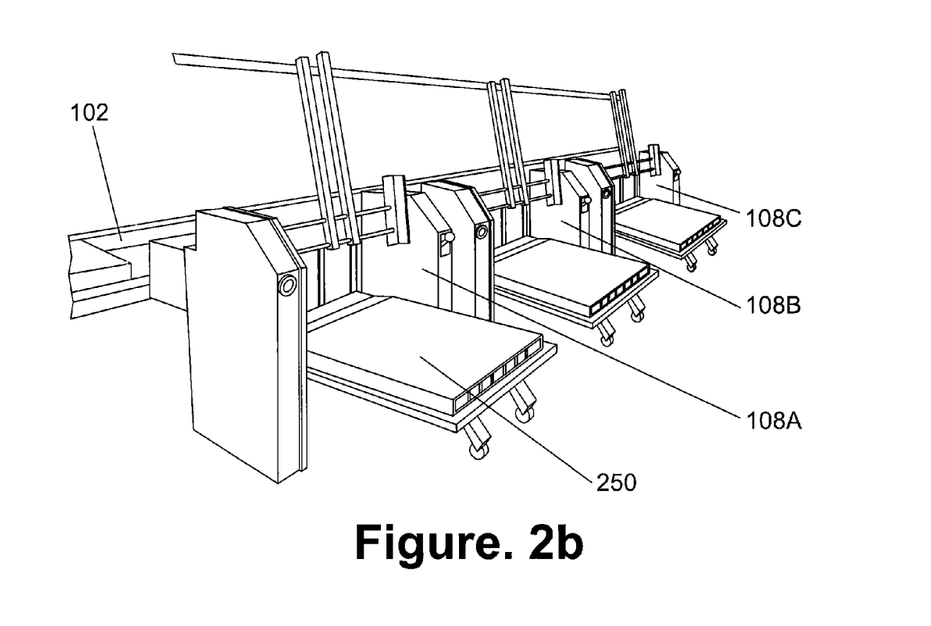
Figure 2C:
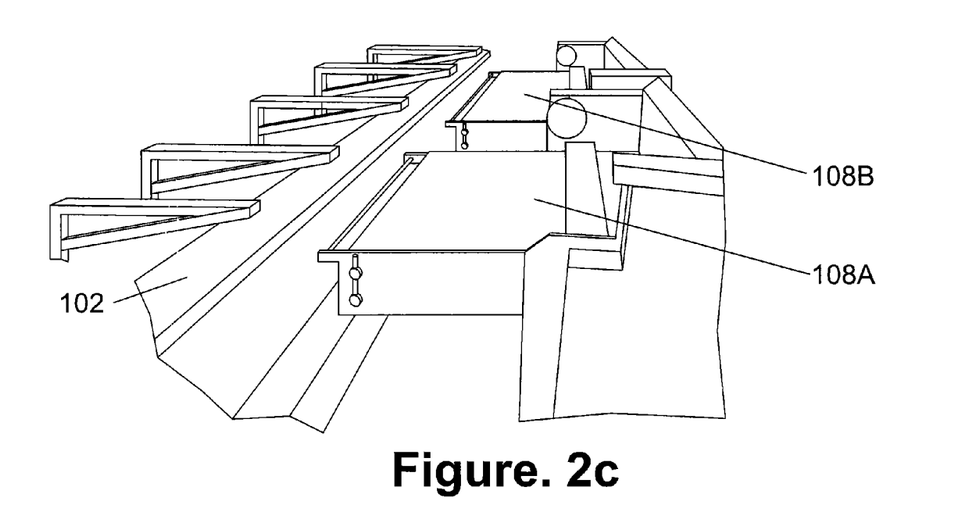
Figure 2D:
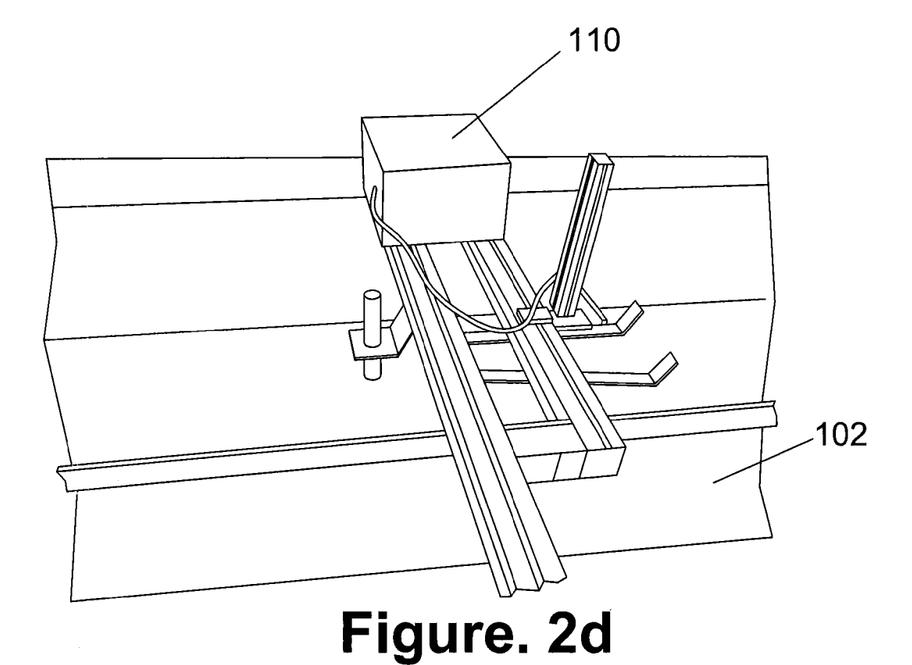
Figure 2E:
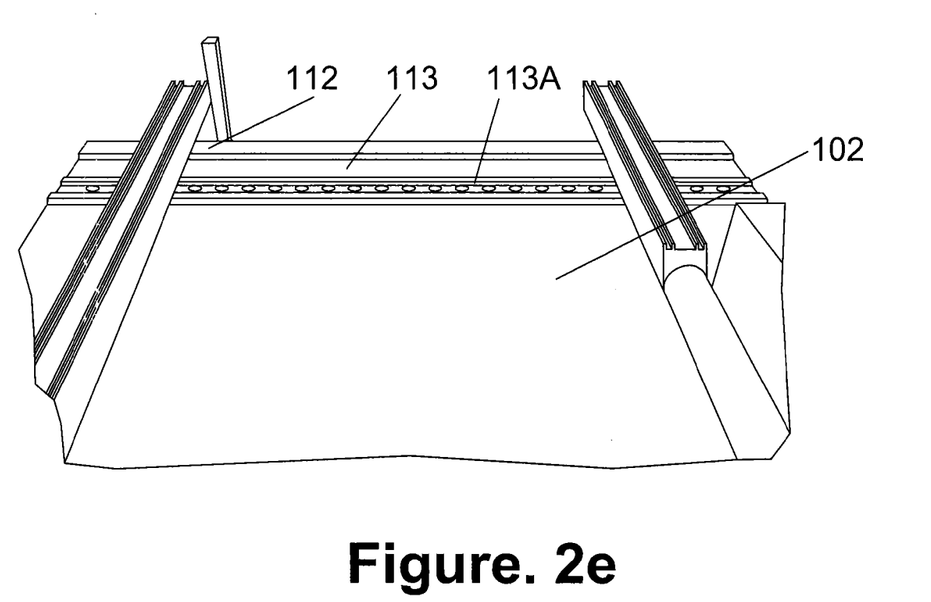

Each form is then passed to registration system 112, illustrated in FIGS. 2*a* and 2*e*. The registration system 112 ensures that the leading edge of each form is correctly aligned before being printed. To ensure alignment, the registration system 112 uses a side perpendicular to the leading edge of the form. The conveyor 102 is canted causing the form to move to the left—indicated by the block arrow in FIG. 2*e*—until the left side of the form is in contact with fence 113 and to move parallel thereto. A row of ball bearings 113A is disposed above the conveyor 102 such that the ball bearings 113A roll on the form to prevent the same from moving out of alignment.

Industry standard vacuum table conveyors can be used for moving the forms after registration to maintain the registration of the forms during the following processing steps.

Figure 2F:
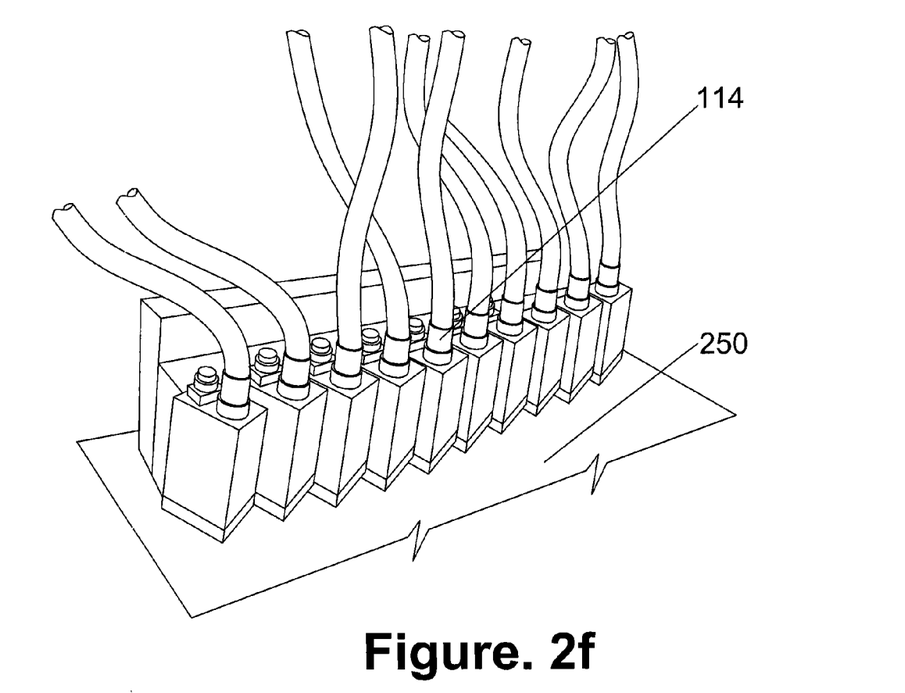

After alignment the forms 250 are passed under first printing mechanism 114, illustrated in FIGS. 2*a* and 2*f*. The first printing mechanism 114 comprises, for example, a plurality of printing heads disposed above the conveyor 102 such that each printing head prints the first printing data—step 18 in FIG. 3—associated with the tickets belonging to a same column of the array 254A of tickets while the form is passed under the printing head. The printing heads are, in one case, standard printing heads—for example, ink jet printing heads or laser printing heads—used in the printing industry. The first print identifier 258 can be printed in the edge portion 252A of the form 250. The first identifier is a unique identifier indicative of the first printing data printed on the form and is unique for each array 254A of the series of forms.

Figure 2G:
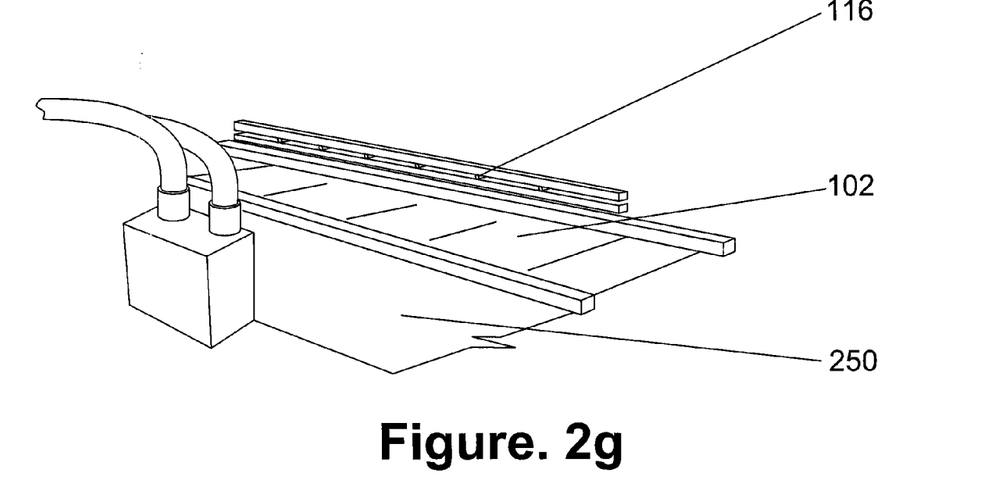

After printing, the forms 250 are passed—step 20 in FIG. 3—under first optical scanner 116 disposed above the conveyor 102, as illustrated in FIGS. 2*a* and 2*g*. The first optical scanner 116 is, for example, an industry standard optical scanner using a Charge-Coupled Device (CCD) or a Contact Image Sensor (CIS). The optical scanner 116 senses the first print and provides to the control computer 130 first print data in dependence thereupon. Using processor 132 of the control computer 130 the first print data are compared with the first printing data—steps 30 to 34—in FIG. 3. If the data match, the form is passed. If the data don't match, the form is failed and rejection data indicative of a rejected form are determined together with location data indicative of a location of the rejected form within the series of forms. The rejection data and the location data are stored in a reject database, for example, in memory 134 of the control computer 130 or the database 152. In one case the failed forms are not removed at this stage of the printing process.

Figure 2H:
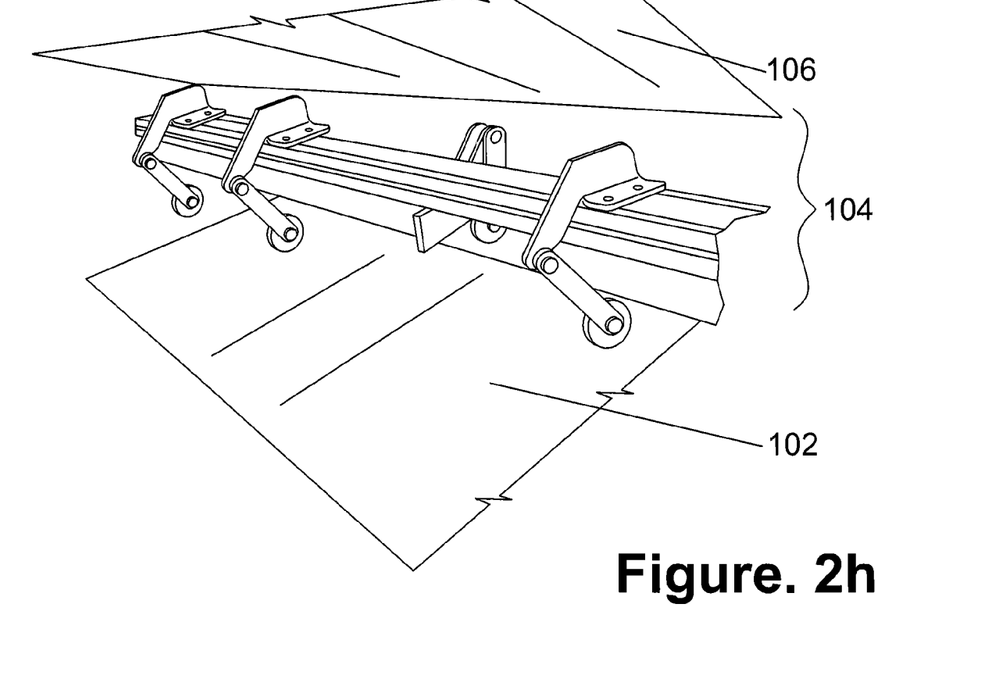

After scanning the forms 250 are passed via inverter 104 onto conveyor 106—such as an industry standard vacuum table conveyor—for printing onto the second surface of the forms, as illustrated in FIGS. 2*a* and 2*h*. The inverter 104 comprises, for example, a concave shaped guide made of a suitable plastic or metal sheet material and placed such that the forms are received from the conveyor 102 and placed onto the conveyor 106. The inverter 104 can be designed such that during the inversion process a predetermined rear portion of the form is still in contact with the conveyor 102 while a predetermined front portion of the form is in contact with the conveyor 106 to maintain the registration of the form.

Figure 2I:
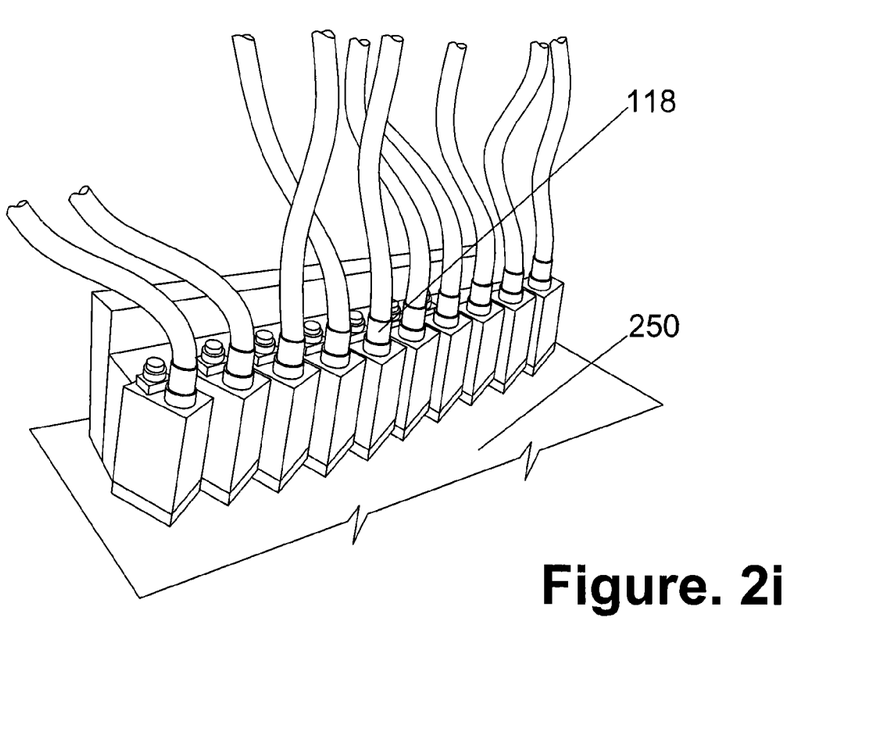

After inverting, the forms 250 are passed—step 22 in FIG. 3—under second printing mechanism 118, as illustrated in FIGS. 2*a* and 2*i*. The second printing mechanism 118 comprises, for example, a plurality of printing heads disposed above the conveyor 106 such that each printing head prints the second printing data associated with the tickets belonging to a same column of the array 254B of tickets while the form is passed under the printing head. The printing heads are standard printing heads—for example, ink jet printing heads or laser printing heads—used in the printing industry. The second print identifier 262 can be printed in the edge portion 252B of the form 250. The second identifier 262 is a unique identifier indicative of the second printing data printed on the form and is unique for each array 254B of the series of forms.

Figure 2J:
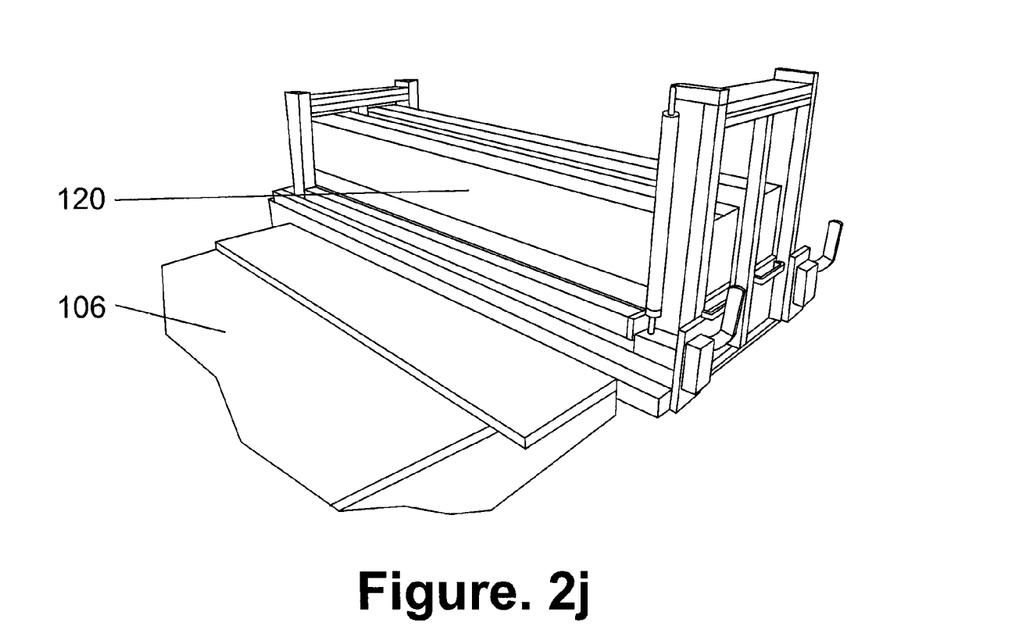

Optionally, UV-dried ink is employed to prevent smudging of the barcodes on the outside of the tickets. For drying the ink, an industry standard UV drier 120 is placed above the conveyor 106 following the second printing mechanism 118, as illustrated in FIGS. 2*a* and 2*j*. Alternatively, the UV-dried ink is employed with the first printing mechanism 114 and the UV drier 120 is interposed between the first printing mechanism 114 and the first optical scanner 116.

Figure 2K:
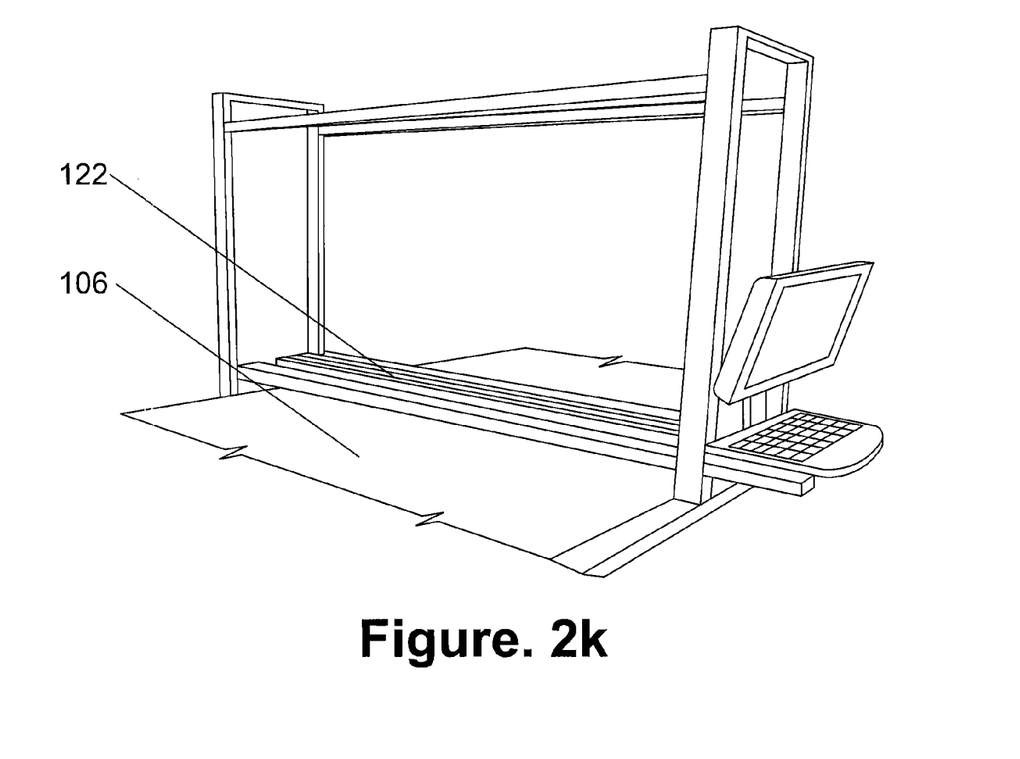

After printing, the forms 250 are passed—step 24 in FIG. 3—under second optical scanner 122 disposed above the conveyor 106, as illustrated in FIGS. 2*a* and 2*k*. The second optical scanner 122 is, for example, an industry standard optical scanner using a Charge-Coupled Device (CCD) or a Contact Image Sensor (CIS). The second optical scanner 122 senses the second print and provides to the control computer 130 second print data in dependence thereupon. Using processor 132 of the control computer 130 the second print data are compared with the second printing data—step 30 in FIG. 3—and, furthermore, the second print identifier 262 is compared with the first print identifier 258 to ensure that the second print data are associated with the respective first print data—step 26 in FIG. 3. If the data match, the form is passed. If the data don't match, the form is failed and rejection data indicative of a rejected form are determined together with location data indicative of a location of the rejected form within the series of forms—steps 28 and 32 in FIG. 3. The rejection data and the location data are stored in a reject database—step 34 in FIG. 3, for example, in memory 134 of the control computer 130 or the database 152. The failed forms are removed at the following stage of the printing process.

Alternatively, provision of the first and second print identifier is omitted and the first and second print data are compared with respective data stored in the database to ensure that the second print data are associated with the respective first print data.

Figure 2L:
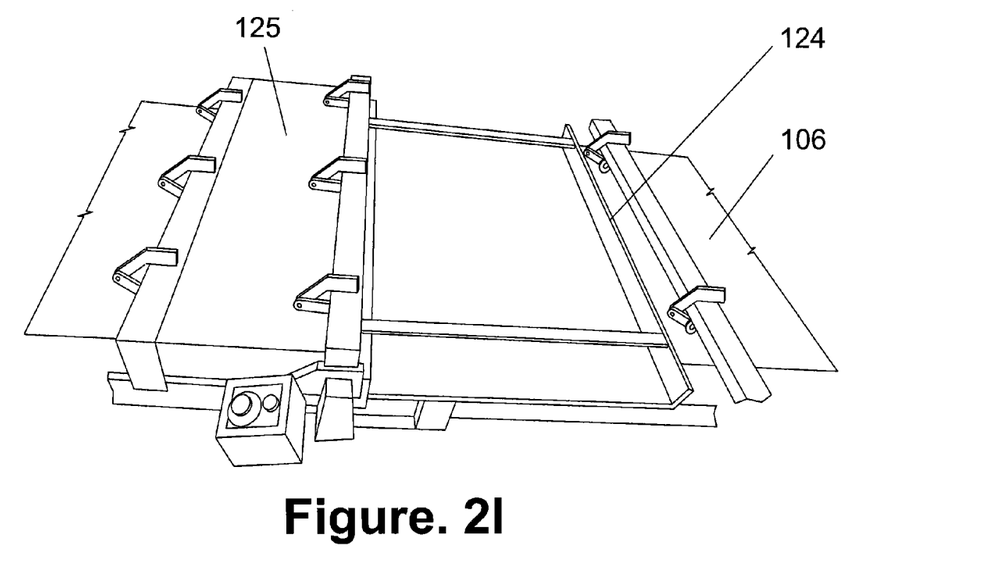
Figure 2M:
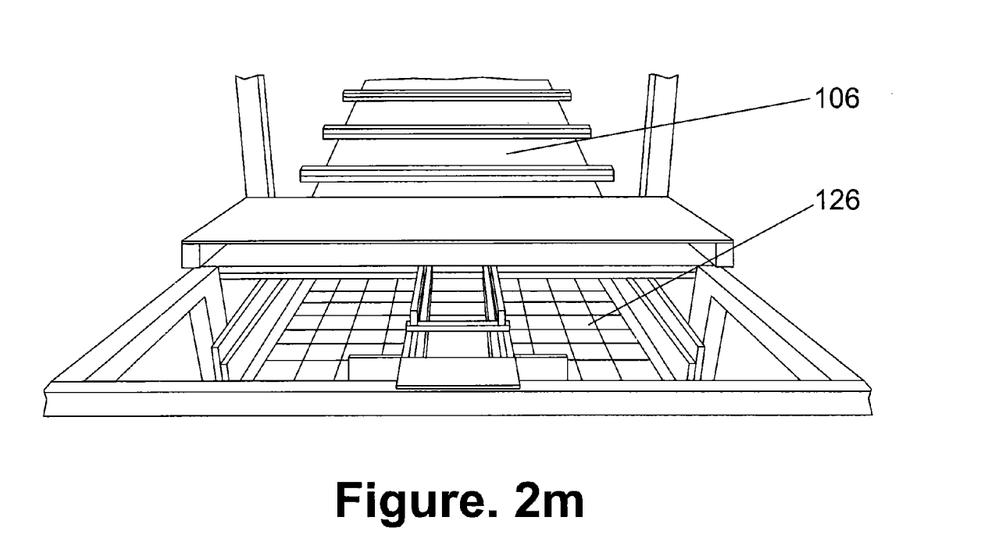

After passing the second optical scanner 122 failed sheets are extracted—step 36 in FIG. 3—using extractor 124, illustrated in FIGS. 2a and 2l. Based on the previously determined rejection data and associated location data the control computer 130 provides a control signal to the extractor 124 to remove a failed form when it reaches the extractor 124. For example, the extractor 124 comprises a barcode scanner for scanning the second print identifier unique for each form to determine if a failed form has reached the extractor 124. Alternatively, the scan result of the second optical scanner 122 together with information related to the speed of the conveyor and the distance between the second optical scanner 122 and the extractor 124 is used. The extractor 124 comprises, for example, a moving mechanism for moving an end section of the conveyor 106 between an upper position to direct a failed form into failed form container 125 and a lower position to direct the form to stacking unit 126, illustrated in FIGS. 2a and 2m, for piling the forms onto a pallet for further processing.

At the end of a production run the data stored in the reject database are used to re-print new copies of the failed forms—step 38 in FIG. 3. The re-printed copies are then inserted in the correct location within the series of forms using, for example, one of the print identifiers 258 and 262—step 40 in FIG. 3. The re-printed copies are inserted manually or in an automated fashion by: sorting the stack of forms; scanning one of the print identifiers 258 and 262 of each form using, for example, a barcode scanner; and inserting a re-printed copy when a location of a failed form has been detected.

The printed forms are then mated with respective forms forming the bottom layer of the tickets using an industry standard laminating machine or pattern gluer. The laminated forms are passed through an industry standard die cutting machine for cutting the tabs followed by an industry standard cutting machine to cut the laminated forms into the individual tickets.

Optionally, in case only a single type of pre-printed forms or un-printed forms is used, only one feeder 108A is employed and the barcode scanner 110 is omitted. In this case all printing is performed by the first printing mechanism 114 and the second printing mechanism 118. Further optionally, additional printing machines are employed, for example, interposed between the registration system 112 and the first printing mechanism 114; and the inverter 106 and the second printing mechanism 118.

Further optionally, printing of the first and second print identifier is omitted and a characteristic unique to the print on each side of each form is used instead. For example, a page number can be used as such a characteristic when printing a small number of books or catalogues in Print On Demand (POD) processes.

The present invention has been described herein with regard to certain embodiments. However, it will be obvious to persons skilled in the art that a number of variations and modifications can be made without departing from the scope of the invention as described herein.

What is claimed is:

1. A system for double-sided printing of a series of sheets comprising:
   a first printing mechanism for printing a first print comprising first printing data onto a first surface of a series of sheets, the first printing data comprising a plurality of first subsets, each first subset for being printed onto a first surface of one sheet;
   a second printing mechanism for printing a second print comprising second printing data onto a second surface of the series of sheets, the second printing data comprising a plurality of second subsets, each second subset for being printed onto a second surface of said one sheet such that for each sheet the second subset is associated with a respective first subset;
   a first optical scanning mechanism for optically scanning the first print on the first surface of each sheet after printing onto the respective sheet to provide first print data;
   a second optical scanning mechanism for optically scanning the second print on the second surface of each sheet after printing onto the respective sheet to provide second print data;
   wherein the first and the second optical scanning mechanism are placed such that the first print is scanned before printing the second print;
   a conveying mechanism connected to the first printing mechanism, the second printing mechanism, the first optical scanning mechanism, and the second optical scanning mechanism, the conveying mechanism for receiving the series of sheets and conveying the same;
   an inverting mechanism connected to the conveying mechanism for inverting the sheets prior to provision to the second printing mechanism, the inverting mechanism being placed between the first optical scanning mechanism and the second printing mechanism;
   a database for storing the first and second print data therein; and,
   a processor connected to the first printing mechanism, the second printing mechanism, the first optical scanning mechanism, the second optical scanning mechanism, and the database, the processor for:
      providing the first printing data and the second printing data;
      receiving the first print data and the second print data; and,
      processing for each sheet the first print data and the second print data to determine if the second print on the second surface is associated with the respective first print on the first surface.

2. A system as defined in claim 1 comprising an extracting mechanism connected to the conveying mechanism and the processor for extracting sheets having second print data other than associated with the respective first print data.

3. A system as defined in claim 1 comprising a feeding mechanism connected to the conveying mechanism and the processor, the feeding mechanism for feeding the sheets of the series of sheets in a predetermined order.

* * * * *